United States Patent [19]

Cowher et al.

[11] Patent Number: 4,583,492

[45] Date of Patent: Apr. 22, 1986

[54] HIGH RATE, LOW TEMPERATURE SILICON DEPOSITION SYSTEM

[75] Inventors: Melvyn E. Cowher, East Brookfield, Mass.; Alexander J. Shuskus, West Hartford, Conn.

[73] Assignee: United Technologies Corporation, Hartford, Conn.

[21] Appl. No.: 562,625

[22] Filed: Dec. 19, 1983

[51] Int. Cl.[4] .............................................. C23C 16/50
[52] U.S. Cl. ..................... 118/723; 118/50.1; 156/DIG. 102
[58] Field of Search ................ 422/245, 250; 156/610, 156/611, 613, 614, 601, DIG. 102; 427/34, 86; 118/50.1, 723, 719, 725; 204/192 S; 219/10.49, 10.67; 373/138–144; 55/465

[56] References Cited

U.S. PATENT DOCUMENTS

| | | | |
|---|---|---|---|
| 3,619,283 | 11/1971 | Carpenter et al. | 156/614 |
| 3,632,429 | 1/1972 | Maeda et al. | 156/610 |
| 4,257,793 | 3/1981 | Kimishima et al. | 55/465 |
| 4,298,629 | 11/1981 | Nozaki et al. | 427/39 |
| 4,379,943 | 4/1983 | Yang et al. | 136/249 |
| 4,398,343 | 8/1983 | Yamazaki | 427/86 |
| 4,479,845 | 10/1984 | Nisizawa et al. | 156/601 |
| 4,500,565 | 2/1985 | Hiramoto | 427/39 |

FOREIGN PATENT DOCUMENTS 74212 3/1983 European Pat. Off. ............ 118/719

OTHER PUBLICATIONS

S. Zirinsky, Retort for Pyrolytic Vapor Deposition of Thin Films, IBM Technical Disclosure Bulletin, vol. 16, No. 4, (Sep. 1973).

Primary Examiner—David L. Lacey
Attorney, Agent, or Firm—M. P. Williams; J. Kevin Grogan

[57] ABSTRACT

A radio frequency, plasma-enhanced, vapor deposition reactor has apparatus (3-7) for providing a flow of silane in an inert gas carrier, a deposition chamber (20) formed between a pair of flow restrictors (18, 27) and an RF coil (22) for providing inductive coupling of RF power (24) for plasma excitation, disposed downstream of a fixture (8) for holding the substrate upon which amorphous silicon is to be disposed. A baffle (30) provides diversion of the gas flow toward a gravity trap chamber (31), thereby collecting some particulates and prolonging the cycle time before plugging of the vacuum pump (7) can occur.

1 Claim, 1 Drawing Figure

U.S. Patent  Apr. 22, 1986  4,583,492
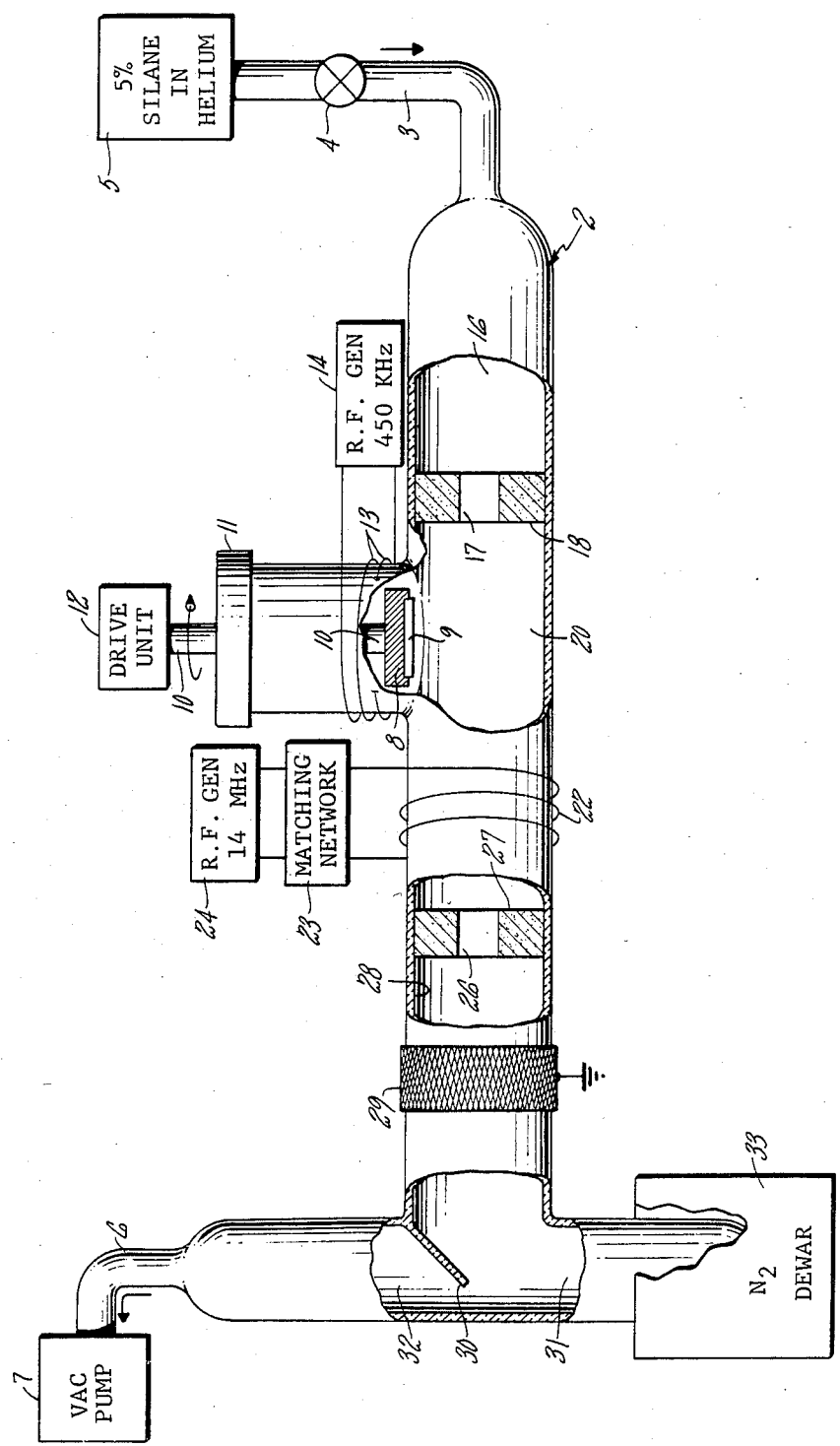

HIGH RATE, LOW TEMPERATURE SILICON DEPOSITION SYSTEM

DESCRIPTION

TECHNICAL FIELD

This invention relates to RF deposition of silicon, and more particularly to an improved reactor employing inductive coupling of RF power for plasma excitation and flow restrictors defining a deposition volume.

BACKGROUND ART

A radio frequency (RF) plasma-enhanced vapor deposition reactor, commonly called the Reinberg system, is typically used for deposition of polysilicon and amorphous silicon, among other things. The system employs a pair of capacitive plates, at the center of which an inert gas, such as helium or argon, containing 5% silane ($SiH_4$) is introduced and caused to flow radially outward between the two plates. On one of the plates, heaters are disposed on one side, and substrates on which silicon is to be deposited are on the other side of the plate so as to be warmed by the heaters. RF power is applied between the two plates to create a plasma, thus decomposing the silane and causing the silicon to be deposited on the substrates. One problem with such a system is that the application of too much RF power causes the formation of fine silicon particulates, resembling snow. On the other hand, utilization of too little RF power causes the formation of polymeric forms of silicon/hydrogen, such as $SiH_2$, which is a gummy substance that can coat the entire system and render it inoperable. In prior systems, the deposition process is very inefficient; a significant amount of the silane is converted into particulates, rather than being converted into deposited silicon. This provides low rates of deposition on the one hand (on the order of 100 angstroms per minute to 200 angstroms per minute), and limits the time (on the order of minutes) the system can be run before it becomes clogged with particulates, on the other hand. This means that if thick layers of deposited silicon are desired, they cannot be deposited in a single cycle; use of multiple cycles results in nonuniformities and other poor quality characteristics of the resultant product, particularly due to surface contamination between runs. Thus, the provision of very thick films of silicon is not commercially feasible with such devices. The foregoing problems are further compounded in cases where the temperature is kept very low (less than 200° C.), such as when depositing amorphous silicon on microelectronic circuits or other devices which would be ruined at higher temperatures.

DISCLOSURE OF INVENTION

Objects of the invention include depositing silicon at high rates and low temperatures, with the capability for long deposition runs and thereby the ability to provide high quality, thick silicon films, and improved silicon deposition which provides minimum contamination of the apparatus and is efficient in the use of the silane/gas mixture.

According to the present invention, a silicon deposition reactor provides inductive coupling of RF power into a flowing as stream so as to create a plasma, the inductive coupling being provided downstream of the deposition zone where the substrate is located. In further accord with the present invention, the deposition zone is located within a deposition volume which is defined between a pair of reduced flow inserts that tend to confine the plasma in the region adjacent to the deposition zone. In still further accord with the invention, a cold trap removes particulates from the gas stream, extending the time that deposition may continue before pump-protection filters become clogged.

The present invention utilizes relatively little RF power (on the order of 50 watts) and is very efficient in its use of the silane/gas mixture (on the order of 100 cc/minute). The invention permits deposition of thick (on the order of 100 microns) high quality amorphous silicon capable of being single-point diamond turned with surface quality as high as 15 angstroms - 25 angstroms RMS, as determined by the interference pattern of a laser scattering technique. Apparatus according to the invention is capable of continuous runs as long as eight hours or more without having any interference in the apparatus created by particulates, thereby enhancing the capability to provide very thick films of amorphous silicon (compared with the prior art) all in a single run, and therefore of uniformly high quality.

The invention is particularly useful where low temperatures are required, since the substrate need only reach about 180° C. for good coverage of amorphous silicon.

The invention is useful for depositing polysilicon as well as amorphous silicon.

The foregoing and other objects, features and advantages of the present invention will become more apparent in the light of the following detailed description of exemplary embodiments thereof, as illustrated in the accompanying drawing.

BRIEF DESCRIPTION OF DRAWINGS

The sole FIGURE herein is a partially broken away, partially sectioned schematic side elevation view of a deposition reactor in accordance with the present invention.

BEST MODE FOR CARRYING OUT THE INVENTION

Referring now to the drawing, a complex reaction tube 2 includes an inlet 3 connected through a flow control valve 4 to a source 5 of a suitable silane solution, such as 5% silane in helium or argon or other suitable inert gas. The reaction tube 2 includes an outlet 6 connected to a vacuum pump 7, thereby causing a flow of gas from the inlet 3 to the outlet 6.

A jig 8, for holding a substrate 9 upon which amorphous silicon is to be deposited, is rotatably disposed on a shaft 10 which passes through a gas seal 11 to a drive unit 12 which rotates the jig 8 and therefore the substrate 9 at a slow rate of speed, such as on the order of ten RPM, as is known in the art. The substrate 9 is inductively heated, such as to about 180° C. for deposition of amorphous silicon or 400° C. for deposition of polysilicon, by a coil 13 driven by an RF generator 14, at a suitable frequency (such as at about 450 kilohertz); the generator may be of the well known Lepel type.

The gas flows from the inlet 3 into a first chamber 16 and through an aperture 17 in an insert 18 to a deposition chamber 20. Surrounding the downstream end of the deposition chamber 20 is another RF coil 22 which is driven through a matching network 23 by an RF generator 24 at a suitable high frequency, (such as about 14 megahertz). The gas then flows through an aperture 26 of a second insert 27, then through a third chamber 28 that is surrounded by an RF ground screen 29, which tends to confine the plasma upstream, and tunes it in some beneficial way. As the stream leaves the chamber 28, it impinges on a baffle 30 that causes the gas flow to first be downward toward a gravity trap chamber 31 and then upward through an additional chamber 32 to the outlet 6. The baffle may be bonded in any suitable way to the reaction tube 2 (such as by glass welding). The gravity trap chamber 31 is immersed in liquid nitrogen with a Dewar 33, which causes particulates to condense out of the gas, thereby avoiding polution of the vacuum pump 7. In fact, deposition runs as long as eight hours have been achieved without blockage of a molecular sieve filter at the entrance to the vacuum pump 7.

The physical parameters of the system are not critical, but exemplary parameters may be of interest. The reaction tube may be about 27 cm long (right to left in the drawing) overall, and 6 to 7 cm in diameter. The RF excitation coil 22 may have an axial length along the chamber 20 of about ten cm and the number of turns can vary significantly without much consequence, all as is known in the art. The insert 18 may be about 4 cm from the center of the jig 8, and the insert 27 may be spaced about 13 cm away from the center of the jig 8; the inserts have been formulated of carbon and have been provided with apertures 17, 26 which are about 1¼ cm high (as seen in the FIGURE) and 2½ cm across (looking into the FIGURE). The inlet 3 and outlet 6 may be 2½ cm diameter, and the chambers 31 and 33 may together extend about 30 cm. Flow rates of on the order of 100 cc per minute are typically useful, being much lower than those of the prior art (on the order of 1,000 cc per minute).

The apparatus according to the present invention has been utilized with deposition rates as high as 3,000 angstroms per minute to produce films of the order of 100 microns thick, in about 6½ hours.

The invention also may be practiced with the coil 22 mounted downstream of the insert 27, without much disadvantage. The apparatus may be utilized to coat laser mirrors, or to provide an overcoat to integrated circuits, as is described in a commonly owned, copending U.S. patent application entitled "Semiconductive Devices With Amorphous Silicon Overcoat", Ser. No. 562,626 filed contemporaneously herewith by Shuskus. The invention may also be used to manufacture amorphous silicon solar cells. It has achieved deposition of $0.4\mu$/min of five grain polysilicon at 400° C., as well.

Although the invention has been shown and described with respect to exemplary embodiments thereof, it should be understood by those skilled in the art that the foregoing and various other changes, omissions and additions may be made therein and thereto, without departing from the spirit and the scope of the invention.

We claim:

1. A RF plasma-enhanced vapor deposition reactor for depositing silicon comprising:
   a reaction tube having an inlet and an outlet;
   means for providing a flow of gaseous silane solution into said reaction tube at said inlet and for exhausting gases from said reaction tube at said outlet;
   a pair of flow-reducing inserts spaced apart along said reaction tube, to define a deposition chamber;
   mounting means for disposing a substrate upon which silicon is to be deposited within said deposition;
   a RF induction coil disposed about said reaction tube entirely downstream of said mounting means; and
   a gravity trap chamber disposed between said deposition chamber and said outlet and a baffle disposed in the reaction tube at said gravity trap chamber so as to divert said flow first toward said gravity trap chamber and then to said outlet.

* * * * *

UNITED STATES PATENT AND TRADEMARK OFFICE
CERTIFICATE OF CORRECTION

PATENT NO. : 4,583,492

DATED : April 22, 1986

INVENTOR(S) : Melvyn E. Cowher and Alexander J. Shuskus

It is certified that error appears in the above-identified patent and that said Letters Patent is hereby corrected as shown below:

Column 1, line 64, after "flowing" "as" should read --gas--.

Column 3, line 10, "with" should read --within--.

Column 4, line 6, "Semiconductive" should read --Semiconductor --.

Signed and Sealed this

Twenty-first Day of March, 1989

Attest:

DONALD J. QUIGG

Attesting Officer

Commissioner of Patents and Trademarks